United States Patent
Jurisson et al.

(10) Patent No.: US 6,316,771 B1
(45) Date of Patent: Nov. 13, 2001

(54) SUPERLATTICE TUNABLE DETECTOR SYSTEM

(75) Inventors: Jaan Jurisson, Fridley; Darryl Lyle Smith, Edina, both of MN (US)

(73) Assignee: Lockhead Martin Corp., Bethesda, MD (US)

( * ) Notice: Subject to any disclaimer, the term of this patent is extended or adjusted under 35 U.S.C. 154(b) by 0 days.

(21) Appl. No.: 06/282,558

(22) Filed: Jul. 13, 1981

(51) Int. Cl.⁷ .............................. H01J 5/02; H01L 27/14; H01L 31/00
(52) U.S. Cl. ...................... 250/339.01; 257/431; 257/442
(58) Field of Search ................................... 357/4, 16, 27, 357/30; 250/211, 339, 338, 339.01; 257/442, 431

(56) References Cited

U.S. PATENT DOCUMENTS

| | | | |
|---|---|---|---|
| 3,763,407 | * 10/1973 | Yazawa | 357/27 |
| 4,208,667 | * 6/1980 | Chang et al. | 357/4 |
| 4,348,686 | * 9/1982 | Esaki et al. | 357/30 |

OTHER PUBLICATIONS

"Magnetic field–induced semimetal–to–semiconductor transition in InAs–GaSb superlattices", N.J. Kawai, L.L. Chang, G. A. Sai–Halasz.

* cited by examiner

*Primary Examiner*—Stephen C. Buczinski
(74) *Attorney, Agent, or Firm*—David W. Gomes

(57) ABSTRACT

An electromagnetic radiation detector system is disclosed which includes a detector of semiconductor material in the form of a superlattice having a plurality of layers of a first conductivity type spaced by alternate layers of a second conductivity type forming a layered structure having distinct natural energy band gap responsive to a narrow band of electromagnetic wavelengths, but which can be tuned by physical or electromagnetic devices to alter the band of wavelengths to which the detector responds. The system includes electrodes connecting the sensor to an output device.

6 Claims, 1 Drawing Sheet

US 6,316,771 B1

SUPERLATTICE TUNABLE DETECTOR SYSTEM

BACKGROUND OF THE INVENTION

1. Field of the Invention

The present invention relates to electromagnetic radiation detection systems. In particular, the present invention is directed to systems utilizing alternate layers of different semiconductor materials to provide a composite superlattice which is capable of being tuned such that the wavelengths of the peak response or energy band gap of the detector in response to electromagnetic radiation may be modulated.

2. Description of the Prior Art

Photo sensitive semiconductors are basically of two types, photoconductive and photovoltaic. When radiation of the proper energy falls upon a photoconductive semiconductor, the conductivity of the semiconductor increases. Energy supplied to the semiconductor causes covalent bonds to be broken, and electron-hole pairs in excess of those generated thermally are created. These increased current carriers decrease the resistance of the material. This "photoconductive effect" in semiconductor materials is sued in photoconductive detectors.

If, on the other hand, the semiconductor sensor is such that it incorporates a pn junction, it gives rise to electron-hole pairs which create a potential difference in response to radiation of the proper energy. This is referred to as a "photovoltaic" effect. While semiconductor electromagnetic radiation detectors can be of either form, the form which is characterized by the photoconductive effect is more generally used.

A photoconductive detector is normally a bar of semiconductor material having electrical contacts at the end. In its simplest form, the photoconductive detector is connected in series with a direct-current voltage source and a load resister. The change in resisitivity of the photoconductive detector in response to incident radiation is sensed in one of two ways. If the resistance of the load resister is much greater than the resistance of the detector, the device is operating in the "constant current mode", since the current through the detector is essentially constant. In this mode, the change in resistivity of the photoconductive detector is usually sensed by measuring the voltage across the photoconductive detector.

If, on the other hand, the resistance of the load resister is much less than the resistance of the detector, the photoconductive detector is operating in the "constant voltage mode", since the voltage across the photoconductive detector is essentially constant. The change in resistivity of the photoconductive detector is usually sensed by measuring the voltage across the load resister.

Of the two detector modes, the constant current mode finds wider use in photoconductive device detectors made from semiconductor materials having low resistivity. Most of the materials utilized for this photoconductive effect are materials of low resistivity and therefore the constant current mode is the normal method of measurement.

In the case of photovoltaic detectors, of course, any conventional method of measuring the voltage generated by the semiconductor may be employed. Usually, the constant current mode described above is used to measure the voltage generated across the photovoltaic detector. Photo detectors, and particularly photoconductive detectors, have found many applications in the prior art. One particularly important area is in the detector of infrared radiation or other types of radiation outside of the visible spectrum. In the prior art, photoconductive semiconductor materials of a given composition have given a peak electromagnetic radiation response over a very narrow band of wavelengths. Thus, the particular composition of the semiconductor material utilized was specifically designed for response in a narrow band. The only method by which the peak response band could be varied was by varying the composition of the semiconductor materials themselves.

For example, one widely used intrinsic infrared sensitive photodetector material is mercury cadmium telluride, which consists of a mixture of cadmium telluride and mercury telluride. Cadmium telluride is a wide gap semiconductor ($Eg=1.6$ eV), and mercury telluride is a semimetal having a "negative energy gap" of about $-0.3$ eV. In the composition of the mercury cadmium telluride alloy (designated $Hg_{1-x}Cd_xTe$), it has been found that the energy gap of the alloy varies linearly with x. By properly selecting x, it has previously been possible to obtain conductor materials having a peak response in any of a wide range of infrared wavelengths. Similarly, other composite photosensitive materials of both the photoconductive and photovoltaic type response by changing the composition to achieve a particular wavelength sensitivity.

More recently, it has been found that "superlattice" materials which are structures consisting of alternating layers of two different semiconductor materials, have a characteristic semimetal-to-semiconductor transition which can be influenced by the presence of a magnetic field. One such material is a superlattice consisting of alternating layers of indium arsenide and gallium antimonide (InAs-GaSb). The characteristic affect of a magnetic field on superlattices with two host semiconductors, particularly InAs and GaSb are discussed in "Kawai, N. J., et al" Magnetic Field-Induced Semimetal-to-Semiconductor Transition in InAs-GaSb Superlattices, Applied Physics Letters 36(5), 369 (March, 1980).

It can be seen from the above discussion, that highly sensitive photoconductive or photovoltaic sensors having a variation of peak response wavelengths can be produced. However, it has heretofore been necessary to change the composition of the detector material in order to vary the peak response wavelength. Therefore, for each peak wavelength or band gap required to be detected, a different material composition had to be used. Also, the number of substance combinations with proper material band gaps is limited and it may be difficult in some instances to produce a material with the appropriate band gap.

SUMMARY OF THE INVENTION

In accordance with the present invention, the problems associated with the necessity of selecting photoconductive or photovoltaic detector materials based on matching the size of their band gap energy with the photon energy to be detected are solved by the use of system in which the band gap energy of the detector is tunable. The electromagnetic radiation detection system of the present invention utilizes a semiconductor detector having a photosensitive superlattice structure combined with a variable strength magnetic field generator or other device for tuning the peak wavelength response of the superlattice to incident electromagnetic radiation. The semiconductor response output can be detected by conventional current or voltage methods measuring long utilized for such detectors.

The superlattice of the present invention is composed of alternate layers or thin films of combinations of photo sensitive semiconductor materials which consist of materials and compounds thereof taken from combinations of Groups II and VI, III and V, IV, and IV and VI of the Period Table of the elements. Examples of such materials include alternate layers of thin films of InAs and InSb, HgTe and CdTe, GaAs and AlAs, and PbTe and SnTe.

Conventional optics may be used to focus the incident photon radiation on the superlattice structure. In the preferred embodiment, a variable magnetic field is used to tune the band gap energy which is applied perpendicular to the superlattice surface. In addition to the utilization of a variable magnetic field generator, the band gap energy associated with the superlattice material may also be varied, i.e. tunability can be achieved, through the application of mechanical or physical pressure applied to the superlattice detector structure.

BRIEF DESCRIPTION OF THE DRAWINGS

In the drawings wherein like numerals are utilized to depict like parts throughout the same.

DESCRIPTION OF THE PREFERRED EMBODIMENT

Figure 1:
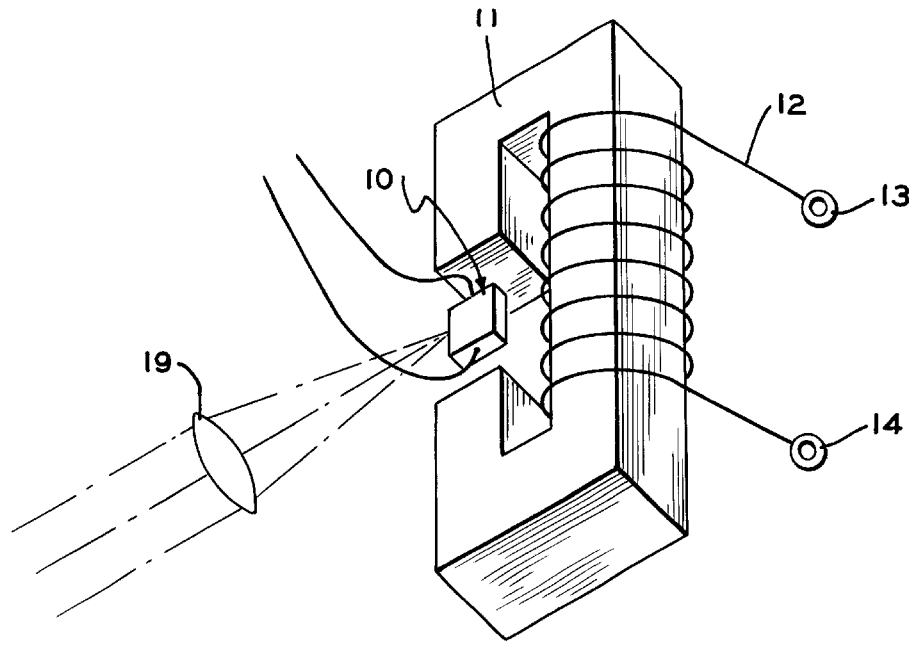
FIG. 1 is a perspective view illustrating a detection system utilizing the present invention.
Figure 2:
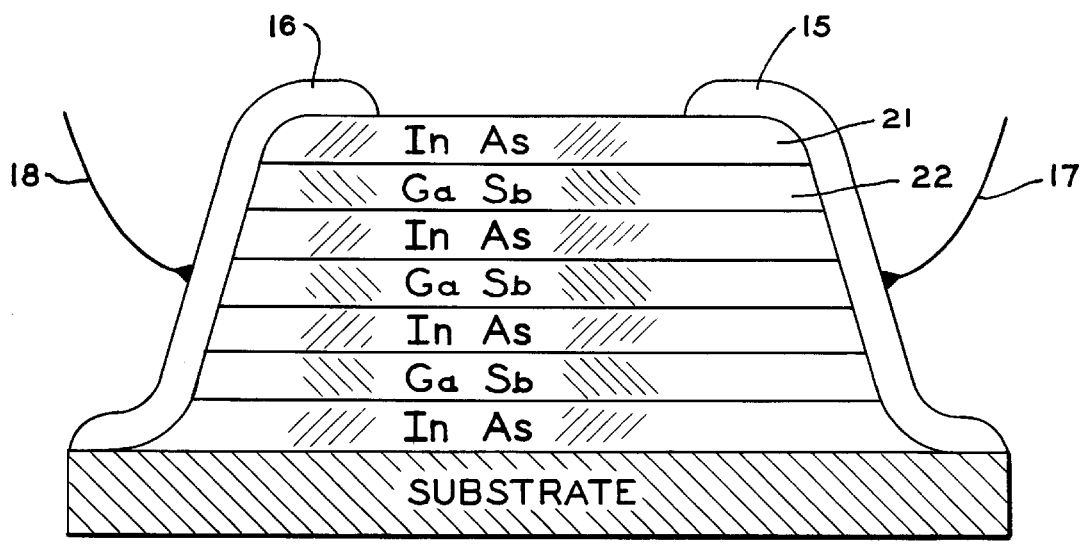
FIG. 2 is an enlarged sectional view of a typical superlattice structure in accordance with the detector of FIG. 1 showing the layered structure.

A basic electromagnetic radiation detection system in accordance with the present invention is illustrated in FIG. 1. The system includes a superlattice detector 10 mounted so as to be surrounded by a laminated magnetic core structure 11 which has an associated conductor winding 12. The conductor winding 12 is, in turn, connected to a suitable source of variable electric power as by connectors 13 and 14. The detector is oriented such that the magnetic field is applied perpendicular to the layered structure. The core 11 may be made out of any suitable laminated magnetic core material such as that used in conventional transformers or the like. The electromagnet shown in FIG. 1 may also be a superconducting magnet. Electrodes 15 and 16, as can better be seen in FIG. 2, are connected to the extremes of the superlattice detector 10 and from there as by conductor 17 and 18, to a suitable output measuring device (not shown) which may be selected from numerous systems well known in the art. A focusing optical system to concentrate the incident electromagnetic energy upon the superlattice detector 10 is depicted at 19.

FIG. 2 illustrates a typical superlattice structure and illustrates the alternate layers of semiconductor which make up that structure. Of course, the superlattice structure itself, is normally deposited on a compatible substrate material such as quartz BaF2, or the like. Any suitable single crystal substrate material which does not interfere with the desired properties of the superlattice and which adds the necessary strength and mountability to it may be utilized.

In operation, incident radiation is focused by the optical system 20 on the multiple layers of the superlattice structure as illustrated as at 21 and 22 of FIG. 2. Electrical current introduced in coil 12 of a known magnitude is used to produce a known electromagnetic effect upon the superlattice detector 10 and is adjusted to produce a peak response at the desired wavelength in that detector. The superlattice detector is basically a simple device. Incident radiation of the proper band gap excites electrons from states near the top of the valence band of the semiconductor material across its energy gap and escapes near the bottom of the conduction band producing excess electron-hole pairs which change the electrical properties of the material. The form in which this change appears depends on certain properties and configurations of the material. In a photoconductive superlattice material, the change to be detected is an increase in electrical conductivity; whereas in a sensor having a pn junction of where the response is photovoltaic the output is detected as a photovoltage.

As previously discussed with regard to superlattice systems, the energy band gap is influenced by the presence of an external magnetic field. This means that in such superlattice configurations utilizing nay one of many possible materials, the band gap energy transition point can be tuned to match the photon energy desired to be detected. This gives known superlattice material configurations a much wider range of possible uses insofar as detecting photons in different parts of the spectrum is concerned and enables the use of materials in ranges of the spectrum outside their natural spectral response bands. This, of course, makes it possible to synthesize semiconductors with any required band gap and eliminates the need for expensive optical filters in applications where spectral discrimination is specifically required.

It has been found, for example, that an InAs-GaSb band gap can be varied from 0 eV to a given value. InAs-GaSb detectors, thus, can be tuned over a very broad band width from about 5.0 microns to a nearly infinite wavelength. Other materials such as HgTe-CdTe, PbTe-SnTe and GaAs-AlAs may also be used to respond to very broad band widths utilizing electromagnetic tuning.

In addition to the electromagnetic tunability, the superlattice detector materials in accordance with the present invention may be tuned to respond to a great variety of peak response wavelengths by the application of mechanical or physical pressure such as applying compressive force to the structure by means of a clamping device or the like. Hydraulic or pneumatic systems may also be used.

Depending upon the precise nature of the superlattice involved the detectors in accordance with the present invention can be used either in the photoconductive or photovoltaic mode. Normally the photoconductive mode is preferred, and, in that case, the sensor output is normally sensed in the constant current mode.

The superlattice structures in accordance with the detector of the present invention can be produced by conventional methods for growing the crystals of the materials involved or other processes including conventional fabrication by molecular beam epitaxy. It has been found that the alternate layers of the superlattice material should be in the range of 20 Angstroms to about 150 angstroms thick in order to produce the best photodetection results in accordance with the present invention. While this thickness range is generally applicable to InAs-GaSb systems and those involving HgTe-CdTe, the precise range of thicknesses applicable to others of the many possible materials one can use in the superlattice systems of the present invention can also readily be determined from about 5.0 mircrons to a nearly infinite wavelength. Other materials such as HgTe-CdTe, PbTe-SnTe and GaAs-AlAs may also be used to respond to very broad band widths utilizing electromagnetic tuning.

In addition to the electromagnetic tunability, the superlattice detector materials in accordance with the present invention may be tuned to respond to a great variety of peak response wavelengths by the application of mechanical or physical pressure such as applying compressive force to the structure by means of a clamping device or the like. Hydraulic or pneumatic systems may also be used.

Depending upon the precise nature of the superlattice involved the detectors in accordance with the present invention can be used either in the photoconductive or photovoltaic mode. Normally the photoconductive mode is preferred, and, in that case, the sensor output is normally sensed in the constant current mode.

The superlattice structures in accordance with the detector of the present invention can be produced by conventional methods for growing the crystals of the materials involved or other processes including conventional fabrication by molecular beam epitaxy. It has been found that the alternate layers of the superlattice material should be in the range of 20 Angstroms to about 150 Angstroms thick in order to produce the best photodetection results in accordance with the present invention. While this thickness range is generally applicable to InAs-GaSb systems and those involving HgTe-CdTe, the precise range of thicknesses applicable to others of the many possible materials one can use in the superlattice systems of the present invention can also readily be determined.

The embodiments of the invention in which an exclusive property or right is claimed are defined as follows:

1. An electromagnetic radiation detecting system comprising:

a detector of semiconductor material in the form of a superlattice having a plurality of layers of a first conductivity type spaced by alternate layers of a second conductivity type such that the layered structure formed thereby has a distinct natural energy band gap which produces a characteristic response to electromagnetic radiation of a given range of wavelengths incident on that structure;

first and second electrode means joining said layers and attached to opposite extremes of said layered structure;

means for tuning the response energy gap of said superlattice to thereby alter the band of wavelengths to which the detector responds;

sensing means connected to said first and second electrode means to sense said detector response.

2. The electromagnetic radiation detection system of claim 1 wherein said body of semiconductor material consists of alternate layers of materials selected from the group consisting of semiconductor materials in groups II and VI, groups III and V, and groups IV and VI of the Periodic Table of the elements.

3. The electromagnetic radiation detection system according to claim 2 wherein said superlattice body consists of alternate layers of material selected from the group consisting of InAs-GaSb, HgTe-CdTe, PbTe-SnTe and AlAs-GaAs.

4. The electromagnetic radiation detection system of claim 1 wherein said means for tuning the response energy gap of said superlattice material comprises a variable magnetic field generating means.

5. The electromagnetic radiation detection system of any of claims 1, 2 or 3 wherein said superlattice structure produces a photoconductive response to incident electromagnetic radiation of the tuned band gap.

6. The apparatus of claim 3 wherein said superlattice material consists of alternate layers of InAs and GaSb having thickness from about 20 Angstroms to about 150 Angstroms.

* * * * *